(12) United States Patent
Clarke et al.

(10) Patent No.: US 7,218,104 B2
(45) Date of Patent: May 15, 2007

(54) SQUID DETECTED NMR AND MRI AT ULTRALOW FIELDS

(76) Inventors: John Clarke, 657 Cragmont Ave., Berkeley, CA (US) 94708; Robert McDermott, 2490 Franklin Ave., Louisville, CO (US) 80027; Alexander Pines, 710 Keeler Ave., Berkeley, CA (US) 94708; Andreas Heinz Trabesinger, Universitaestrasse 55, CH-8006 Zurich (CH)

( * ) Notice: Subject to any disclaimer, the term of this patent is extended or adjusted under 35 U.S.C. 154(b) by 0 days.

(21) Appl. No.: 11/534,757

(22) Filed: Sep. 25, 2006

(65) Prior Publication Data

US 2007/0018643 A1   Jan. 25, 2007

Related U.S. Application Data

(63) Continuation of application No. 11/277,550, filed on Mar. 27, 2006, now Pat. No. 7,116,102.

(51) Int. Cl.
*G01V 3/00* (2006.01)

(52) U.S. Cl. .................. 324/300; 324/306; 600/421

(58) Field of Classification Search ............... 324/300, 324/306, 307, 309, 318, 322; 600/421, 422, 600/410
See application file for complete search history.

(56) References Cited

U.S. PATENT DOCUMENTS

| | | | | |
|---|---|---|---|---|
| 5,254,950 A | * | 10/1993 | Fan et al. | 324/322 |
| 5,343,147 A | * | 8/1994 | Sager et al. | 324/239 |
| 6,031,373 A | * | 2/2000 | Szeles et al. | 324/300 |
| 6,159,444 A | * | 12/2000 | Schlenga et al. | 424/9.3 |
| 6,815,949 B2 | * | 11/2004 | Kandori et al. | 324/248 |
| 6,885,192 B2 | * | 4/2005 | Clarke et al. | 324/300 |
| 7,053,610 B2 | * | 5/2006 | Clarke et al. | 324/300 |
| 7,116,102 B2 | * | 10/2006 | Clarke et al. | 324/300 |

* cited by examiner

*Primary Examiner*—Louis M. Arana
(74) *Attorney, Agent, or Firm*—Joseph R. Milner; Lawrence Berkeley Lab

(57) ABSTRACT

Nuclear magnetic resonance (NMR) signals are detected in microtesla fields. Prepolarization in millitesla fields is followed by detection with an untuned dc superconducting quantum interference device (SQUID) magnetometer. Because the sensitivity of the SQUID is frequency independent, both signal-to-noise ratio (SNR) and spectral resolution are enhanced by detecting the NMR signal in extremely low magnetic fields, where the NMR lines become very narrow even for grossly inhomogeneous measurement fields. MRI in ultralow magnetic field is based on the NMR at ultralow fields. Gradient magnetic fields are applied, and images are constructed from the detected NMR signals.

20 Claims, 8 Drawing Sheets

REDUCE MEASUREMENT FIELD STRENGTH

NMR SPECTRUM $B(z) = B_0$

FIG. 2B

1-D PROJECTION $B(z) = B_0 + G_z z$

REDUCE MEASUREMENT FIELD STRENGTH

SQUID DETECTED NMR AND MRI AT ULTRALOW FIELDS

RELATED APPLICATIONS

This continuing patent application claims priority of U.S. patent Ser. No. 11/277,550 filed on Mar. 27, 2006, to be issued as U.S. Pat. No. 7,116,102 on Oct. 3, 2006, which in turn claims priority to U.S. patent application Ser. No. 10/995,765 filed Nov. 22, 2004, now issued as U.S. Pat. No. 7,053,610 on May 30, 2006, which in turn claims priority to U.S. patent application Ser. No. 10/360,823 filed Feb. 6, 2003, now issued as U.S. Pat. No. 6,885,192 on Apr. 26, 2005, which claims priority of Provisional Application 60/355,577 filed Feb. 06, 2002, now abandoned, which are all hereby incorporated by reference in their entireties.

GOVERNMENT RIGHTS

The United States Government has rights in this invention pursuant to Contract No. DE-AC02-05CH11231 between the United States Department of Energy and the University of California.

BACKGROUND OF THE INVENTION

The invention relates generally to nuclear magnetic resonance (NMR) and magnetic resonance imaging (MRI), and more particularly to low noise NMR and MRI at ultralow magnetic fields.

Nuclear magnetic resonance (NMR) is a technique for obtaining information about atoms and the molecules they form. NMR operates on atoms having nuclei in which at least one proton or neutron is unpaired. This imbalance causes these nuclei to spin on an axis like miniature tops and gives rise to a magnetic moment, i.e. the nuclei behave like magnets with north and south poles.

When exposed to an external magnetic field, these spinning magnets attempt to align their axes along the lines of magnetic force. The alignment is not exact, however, resulting in a wobbly rotation (precession) about the force lines that is unique for each type of nuclei. If, while exposed to the magnetic field, the nuclei are bombarded with radio (RF) waves, they will absorb and re-emit energy at a specific frequency according to their rate of rotation. This resonating frequency therefore becomes a signature signal by which the nuclei can be identified.

When nuclei absorb the energy of an incoming radio wave, they are knocked out of alignment with the external magnetic field lines. As they subsequently lose this energy, the nuclei come back into alignment. The rate at which resonating nuclei realign themselves with magnetic field lines provides detailed information on their position and motion with respect to neighboring nuclei. This provides a noninvasive technique to study the structural, dynamic, and spatial relationships of atoms in a sample of molecules.

NMR has two basic subsets—spectroscopy and imaging. In NMR spectroscopy, the frequency of the incoming radio wave is varied, and all of the different frequencies absorbed and emitted by the nuclei are measured to obtain a resonance spectrum. This NMR spectrum reveals the molecular makeup of the material down to the respective positions and motions of the constituent atoms.

In magnetic resonance imaging (MRI), the frequency of the incoming radio wave is kept constant, but the strength of the external magnetic field is varied. The resulting signal corresponds to the total number of spinning nuclei present in any part of the sample, i.e. the atomic density of the sample at that point. Information obtained from an array of points can be translated by computer into a recognizable image.

Since the invention of MRI in the early 1970's, MRI scanners have steadily developed towards higher magnetic field strengths. The enhanced sensitivity attainable at high field makes it possible to resolve features at ever shorter length scales, and enables fast imaging experiments with close to real-time resolution. State-of-the-art clinical scanners operate at field strengths of 1.5 T, corresponding to a proton Larmor frequency of 64 MHz; currently, there is a drive to gain approval for 4 T imagers for clinical use. A number of facilities around the world now have 7 T scanners for research purposes.

At the same time, the last three decades have seen continued effort toward the development of systems for MRI in low magnetic fields. Much of this work has been motivated by considerations of cost: a commercial full-body imager operating at 1.5 T costs several million dollars, and the operation of such a machine places considerable demands on the infrastructure of the hospital or research facility. In addition, due to the size and complexity of the high-field system, it must necessarily remain fixed in one location, and the sample or subject must be transported to the system and inserted into the confining bore of the high field magnet; in certain cases this is simply not possible. A low-cost, portable MRI scanner is extremely appealing, as is an open MRI system, which would enable acquisition of MRIs at the same time that a medical procedure is performed. Inexpensive, portable imagers would enable MRI to address a wide variety of new problems, potentially transforming MRI usage from a highly specialized clinical and research technique to a much more widespread, flexible tool for rapid patient screening and general noninvasive imaging. However, any sort of portable or open MRI system would need to operate at relatively low magnetic field strengths.

Moreover, despite the serious disadvantage of reduced sensitivity, the images acquired in low field should, in principle, be of higher quality than those acquired in high magnetic field. An inevitable drawback of high-field imaging is that of susceptibility artifacts. When a heterogeneous sample is placed in a magnetic field, variations in magnetic susceptibility over the sample volume give rise to spurious magnetic field gradients. When these spurious gradients become comparable to the gradients that are used for encoding, the image is severely distorted. In medical imaging, the presence of dental fillings or jewelry is enough to destroy the MRI; abrupt changes in susceptibility at solid-liquid and solid-air interfaces inside the body, such as in the sinuses, produce distortions which are more subtle, but which nevertheless place strict limits on the achievable spatial resolution. Since the strength of the spurious gradients scales linearly with the strength of the applied field, it is possible to eliminate susceptibility-induced distortions entirely by imaging in low magnetic field.

Finally, $T_1$ contrast in tissue is enhanced in low magnetic field. Because of this, low-field images allow sharper differentiation of different organs and tissue types, and potentially contain richer information than the corresponding images acquired in high field. (It is interesting to note that, in the early days of MRI, many researchers were skeptical that high-field MRI would ever amount to a useful clinical tool, precisely because of the degradation of tissue contrast in high field.)

There have been a number approaches to low-field MRI in recent years. These have generally relied on Faraday detection in a static field of order 10 mT to 100 mT, which is generated by an electromagnet. The main obstacle in these studies is the low sensitivity intrinsic to the low field experiment. In a different approach, H. C. Seton et al., "A 4.2 K receiver coil and SQUID amplifier used to improve the SNR of low-field magnetic resonance images of the human arm," Meas. Sci. Technol. 8, 198–207 (1997) employed a tuned SQUID magnetometer for NMR detection; the SQUID provided an SNR enhancement of a factor of 2.8–4.5 over conventional detection in images acquired from room temperature samples in a field of 10 mT. In the low-field imaging work of A. Macovski et al., "Novel approaches to low cost MRI," Magn. Reson. Med. 30, 221–230 (1993) and W. Shao et al., "Low readout field magnetic resonance imaging of hyperpolarized xenon and water in a single system," Appl. Phys. Lett. 80, 2032–2034 (2002), spins were prepolarized in a field of 0.3 T, while the NMR signals were detected in a much lower field of 30 mT. Here, the homogeneity of the polarizing field was not crucial, and the prepolarization step led to an enhancement of sample magnetization by an order of magnitude. Using similar techniques, J. Stepišnik et al., "NMR imaging in the Earth's magnetic field," Magn. Reson. Med. 15, 386–391 (1990) and G. Planinšič et al., "Relaxation-time measurement and imaging in the Earth's magnetic field," J. Magn. Reson. Ser. A 110, 170–174 (1994), acquired MRIs in the magnetic field of the Earth ($B_{Earth}$~50 µT), demonstrating the enhanced $T_1$ contrast attainable in low-field. In both the works of Macovski et al. and Stepišnik et al., however, Faraday detection in the field of the Earth entailed substantial signal loss.

Superconducting Quantum Interference Devices (SQUIDs) are sensitive detectors of magnetic fields based on the quantum mechanical Josephson effect. SQUIDs are based on superconductors, whose resistance drops to zero when cooled to a critical temperature $T_c$. A SQUID is formed by separating its superconducting material with a very thin insulating barrier through which electron pairs can tunnel. This combination of superconducting material and insulating barrier forms a Josephson junction, i.e. two superconductors joined by a weak link. The SQUID consists of a superconducting ring or square interrupted in two spots by Josephson junctions. When sufficient electrical current is applied to the SQUID, a voltage is generated across its body. In the presence of a magnetic field, this voltage will change as the strength of the field changes. Thus the SQUID turns a change in a magnetic field, which is more difficult to measure, into a change in voltage, which is very easy to measure.

For application purposes, SQUIDs are almost always coupled to auxiliary components. To form a magnetometer, a SQUID is connected to a flux transformer, a device consisting of a relatively large loop of superconducting material and a much smaller multiturn coil. Since the large loop picks up a magnetic field over a much greater area, the sensitivity of the SQUID to changes in magnetic field strength is boosted manyfold.

Originally SQUIDs were made with low $T_c$ superconductors, e.g. niobium ($T_c$=9.5° K), which required cooling with liquid helium. More recently, high $T_c$ SQUIDs have been made, using high $T_c$ ceramic oxide superconducting materials, e.g. yttrium barium copper oxide (YBCO) materials ($T_c$=93° K), which only require cooling with liquid nitrogen, which is much less expensive and easier to work with than liquid helium. A high $T_c$ low noise SQUID is described in U.S. Pat. No. 6,023,161 issued Feb. 08, 2000.

Low transition temperature SQUIDs have been used experimentally to detect NMR and nuclear quadrupole resonance (NQR) signals, e.g. Dinh M. Ton That et al., "Direct current superconducting quantum interference device spectrometer for pulsed nuclear magnetic resonance and nuclear quadrupole resonance at frequencies up to 5 MHz," Rev. Sci. Instr. 67, 2890 (1996). Low $T_c$ SQUIDs have been used to image polarized helium and xenon at relatively low fields, e.g. M. P. Augustine et al., "Low field magnetic resonance images of polarized noble gases obtained with a dc superconducting quantum interference device," Appl. Phys. Lett. 72 (15), 1908 (1998). The feasibility of using a high $T_c$ SQUID to detect NMR signals has been demonstrated, S. Kumar et al., "Nuclear magnetic resonance using using a high temperature superconducting quantum interference device," Appl. Phys. Lett. 70 (8), 1037 (1997).

SQUIDs were first used in the 1980s to detect NMR signals in low magnetic field. However, the majority of SQUID NMR studies have been performed on samples in the solid state, at liquid helium (LHe) temperatures. Recently, there has been increased interest in extending SQUID NMR techniques to samples in the liquid state, and in particular to systems which are biologically relevant. S. Kumar et al., "Broadband SQUID NMR with room temperature samples," J. Magn. Reson. B 107, 252 (1995) demonstrated NMR spectra from animal tissue measured at room temperature. H. C. Seton et al., ibid., used SQUIDs to image room temperature samples in a field of 10 mT, and K. Schlenga et al., "Low-field magnetic resonance imaging with a high-$T_c$ dc superconducting quantum interference device," Appl. Phys. Lett. 75, 3695–3697 (1999) and U.S. Pat. No. 6,159,444 issued Dec. 12, 2000, used a SQUID magnetometer fabricated from the high transition temperature superconductor YBCO to image thermally polarized proton samples at room temperature in a field of 2 mT. Despite these early efforts, however, SQUID NMR studies of liquid samples remain extremely limited in number and in scope. The central challenge for SQUID NMR studies of liquids is that of low sensitivity. Thermal polarizations are two orders of magnitude lower at 300 K than at 4.2 K. Moreover, in order to cool the SQUID below its superconducting transition temperature, it is necessary to thermally isolate the detector from the sample; filling factor is therefore quite low.

The NMR effect is produced by a spin magnetic moment on nuclei in a sample. A magnetic field causes the spin magnetic moments to precess around the field at the Larmor frequency $\omega$ which is proportional to the magnetic field.

In low field NMR (typically $\leq$10 mT) the spin precesses at correspondingly low frequencies, typically below 500 kHz, around the field direction. In conventional NMR, in which a resonant circuit is used to detect the precessing magnetization, the induced voltage signal V is proportional to the spin magnetization M and its rate of change (frequency) $\omega$. Since M is also proportional to the frequency $\omega$, V scales with $\omega^2$. As a result it is difficult to detect NMR signals at low fields with a conventional Faraday detector. In contrast, SQUIDs can be used to measure magnetic flux directly, resulting in much higher signal to noise (S/N) ratio at low frequencies. However, the use of SQUIDs for NMR/MRI has heretofore been limited, and not used at ultralow magnetic fields of tens or hundreds of microtesla.

SUMMARY OF THE INVENTION

Accordingly it is an object of the invention to provide method and apparatus for nuclear magnetic resonance and magnetic resonance imaging at ultralow magnetic fields.

The invention is a method and apparatus for the detection of nuclear magnetic resonance (NMR) signals and production of magnetic resonance imaging (MRI) by obtaining NMR spectra of liquids in microtesla fields using prepolarization in millitesla fields and detection with an untuned dc superconducting quantum interference device (SQUID). Because the sensitivity of the SQUID is frequency independent, both signal-to-noise ratio (SNR) and spectral resolution are enhanced by detecting the NMR signal in extremely low magnetic fields, where the NMR lines become very narrow even for grossly inhomogeneous measurement fields.

The invention operates in ultralow magnetic fields, typically about 100–150 µT, but even tens of µT and down to about 1 µT or less, for detection and typically uses a field of about a few or tens of mT for prepolarization. Sample size can be very small but can be large, i.e. parts of the body. The detector is a SQUID magnetometer designed so that the SQUID detector can be very close to the sample, which is at room temperature.

A cryogenic insert allows small separations between a sample maintained at room temperature and a SQUID detector operated in a liquid helium bath so that NMR signals from samples in the liquid state can be measured using a low-$T_c$ SQUID. Prepolarization is performed by either resonant manipulation of spins in a magnetic field on the order of a few mT or non-resonant spin manipulation with switched static fields. The frequency-independent sensitivity of the untuned SQUID magnetometer allows measurement of NMR signals from the sample in extremely low magnetic fields, down to the order of 1 µT, where the proton Larmor frequency is of the order of tens of Hz. At these fields, NMR linewidths approach the lifetime limit, even in grossly inhomogeneous measurement fields. The reduction of signal bandwidth through reduction of the strength of the measurement field enhances both SNR and spectral resolution. While chemical shift information is lost in the low field, scalar couplings, which are field-independent, are preserved. These scalar couplings act as signatures of specific covalent bonds. Thus the invention includes a simple SQUID-based "bond detector", which yields accurate information about heteronuclear scalar couplings in microtesla fields.

Magnetic resonance imaging in ultralow magnetic field is based on the NMR at ultralow fields. By exploiting the frequency-independent response of the untuned SQUID magnetometer, it is possible to enhance both the SNR and resolution (in this case, spatial resolution) of magnetic resonance images by reducing the strength of the measurement field to eliminate inhomogeneous broadening of the NMR lines.

DETAILED DESCRIPTION OF THE INVENTION

The invention is directed to certain improvements in NMR/MRI as described herein; other aspects of the NMR/MRI systems are conventional and not described since they are well known in the art.

A. Concept of Microtesla Field NMR

Line broadening due to field inhomogeneity is a major liability in liquid-state NMR. Spectral resolution, and therefore the information which one can extract about the interaction of nuclei with the local electromagnetic environment, is ultimately determined by the width of the NMR lines: it is necessary that the strength of the interactions exceed the dispersion of Larmor frequencies in the sample. Moreover, for a fixed sample magnetization, the SNR achieved from a single FID or spin echo signal scales inversely with the inhomogeneously broadened width of the NMR line. For these reasons, high-resolution liquid state NMR requires exquisite field homogeneity. In a conventional high-field spectrometer, homogeneity is attained by supplementing the magnet with sophisticated and costly shim coils. In a state-of-the-art high-field system, homogeneity of a few parts per billion is achieved.

An alternate approach is simply to reduce the strength of the measurement field. For a fixed relative field homogeneity, absolute homogeneity is enhanced by decreasing the strength of the measurement field. Of course, the sensitivity of a conventional NMR detector falls off rapidly as field strength is reduced. However, this is not the case for an untuned SQUID magnetometer, which is sensitive to magnetic flux, rather than the rate of change of magnetic flux. In the context of NMR, this means that, for a fixed sample magnetization, the integrated intensity of the NMR signal—the area under the NMR line—is independent of the frequency of the NMR signal. This makes it possible to perform the following unconventional NMR process.

A sample of nuclear spins is polarized in a magnetic field of the order of 1 mT. In addition to the polarizing field, a much smaller measurement field is applied in an orthogonal direction. The polarizing field is then removed nonadiabatically, inducing precession in the much lower measurement field. The sample magnetization is fixed by the strength of the polarizing field. The width of the NMR line is determined by the absolute homogeneity of the measurement field. As the strength of the measurement field is reduced, the NMR line is compressed into a narrow band and the peak height grows, yielding an enhancement of both spectral resolution and SNR, as shown in FIGS. 1A–D.

Figure 1A:
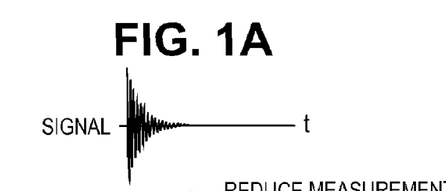
FIGS. 1A–D illustrate the narrowing of signal bandwidth through reduction of measurement field strength.
Figure 1B:
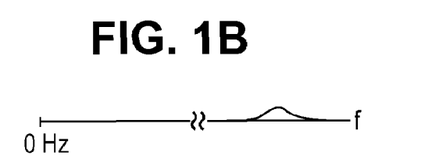
Figure 1C:
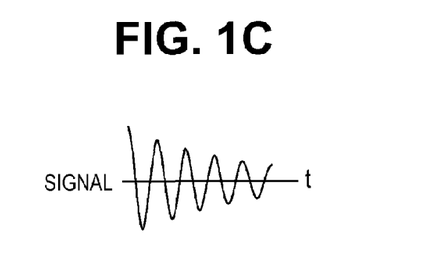
Figure 1D:
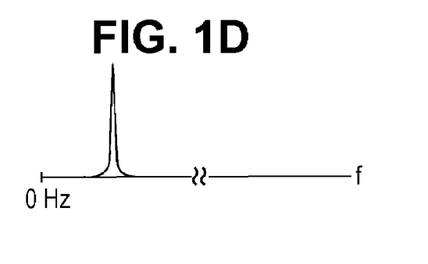

FIG. 1A shows a time trace of an NMR signal measured in a high inhomogeneous magnetic field. The dispersion of Larmor frequencies leads to rapid dephasing of the NMR signal. FIG. 1B shows the NMR spectrum corresponding to FIG. 1A. FIG. 1C shows a time trace of an NMR signal measured in a weak magnetic field with the same relative homogeneity as that in FIG. 1A, using a detector whose sensitivity is independent of frequency. The NMR signal now appears at much lower frequencies. For a fixed sample magnetization, however, the amplitude of the NMR signal is unchanged. Moreover, the effective spin-spin relaxation time $T_2^*$ is much longer, as the absolute homogeneity of the measurement field has been enhanced by reduction of the measurement field strength. FIG. 1D shows the NMR spectrum corresponding to FIG. 1C. The integrated intensity of the NMR signal is conserved upon reduction of measurement field strength. Therefore, as the NMR signal is compressed into a narrow band, the peak height grows, leading to an enhancement of both SNR and spectral resolution.

B. Concept of Microtesla Field MRI

Figure 2A:
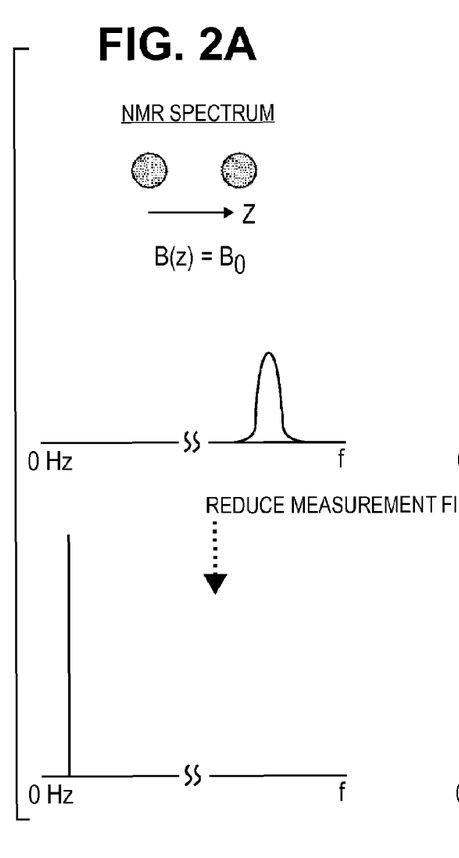
FIGS. 2A, B illustrate the process of MRI in microtesla magnetic fields.
Figure 2B:
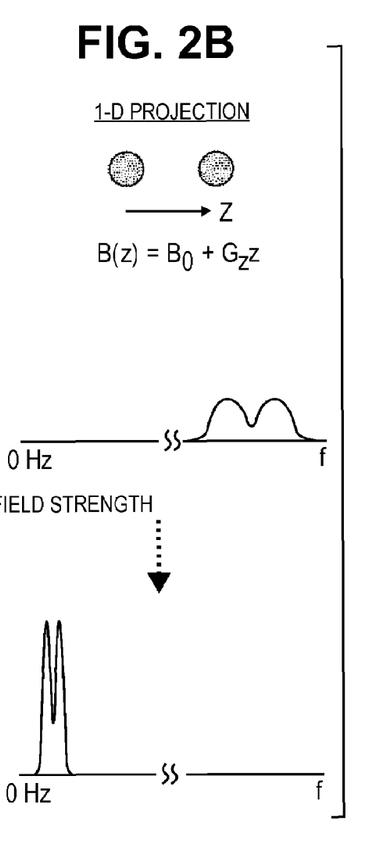

There is an intimate connection between the inhomogeneously broadened width of the NMR line and the spatial resolution that can be achieved in an MRI process. The important parameter is the NMR linewidth, which is determined by the absolute homogeneity of the measurement field, rather than the relative homogeneity. Absolute field homogeneity is conveniently enhanced by reducing the strength of the measurement field. In the case of NMR detection with an untuned SQUID magnetometer, the reduction in measurement field entails no signal loss provided that the sample magnetization is fixed, for example by prepolarization in a higher field. The basic principles for SQUID-detected MRI in microtesla fields is then as shown in FIGS. 2A, B. The sample of nuclear spins is polarized in field of order tens of mT, corresponding to a polarization of around $10^{-7}$. However, instead of detecting the NMR signal in a high field, where it is quite challenging to achieve narrow NMR lines, one measures the NMR signal in an extremely low magnetic field, where it is possible to approach the lifetime limit even for grossly inhomogeneous measurement fields. Now it is necessary to apply only modest magnetic field gradients to perform the encoding. As a result, the NMR signal is dispersed over only a narrow band. The NMR transients are therefore detected with a high SNR, and the time required to acquire the image is relatively short.

FIG. 2A shows an NMR spectra acquired from a sample (at top) consisting of two separate regions containing nuclear spins which is immersed in a magnetic field which is nominally homogeneous, but which involves spurious gradients which give rise to inhomogeneous broadening of the NMR lines. At high measurement field strengths, the absolute homogeneity of the field is relatively poor, and the NMR line is relatively broad (center). As the strength of the measurement field is reduced, the absolute homogeneity of the field is enhanced, and the NMR line is narrowed (bottom). In the case of fixed sample magnetization and detection with an untuned SQUID magnetometer, the reduction of measurement field strength also leads to an enhancement of SNR.

FIG. 2B is similar to FIG. 2A, but now a magnetic field gradient $G_z$ is applied in order to perform a one-dimensional MRI projection (top). At relatively high measurement field strengths, relatively strong gradients are needed in order to clearly resolve the two spatially distinct regions of the sample (center). As a result, the NMR signal is dispersed over a large band, and SNR is poor. At low measurement field strengths, inhomogeneous broadening of the NMR lines is largely eliminated. As a result, only modest magnetic field gradients are needed to resolve the two spatially distinct regions of the sample. Therefore, the NMR signal remains confined to a relatively narrow band (bottom), and SNR is relatively high.

Even in the absence of homogeneous and inhomogeneous line broadening (infinite $T_2$ and perfect field homogeneity), MRI resolution is ultimately limited by spin diffusion which occurs during the encoding intervals. However, the invention is directed at imaging at the mm length scale; therefore, spin diffusion does not present a problem. Of course the effects of diffusion can also be overcome by limiting the length of the encoding intervals, and increasing the strength of the applied gradients.

C. Experimental Apparatus for NMR

1) Cryogenic Insert

Figure 3:
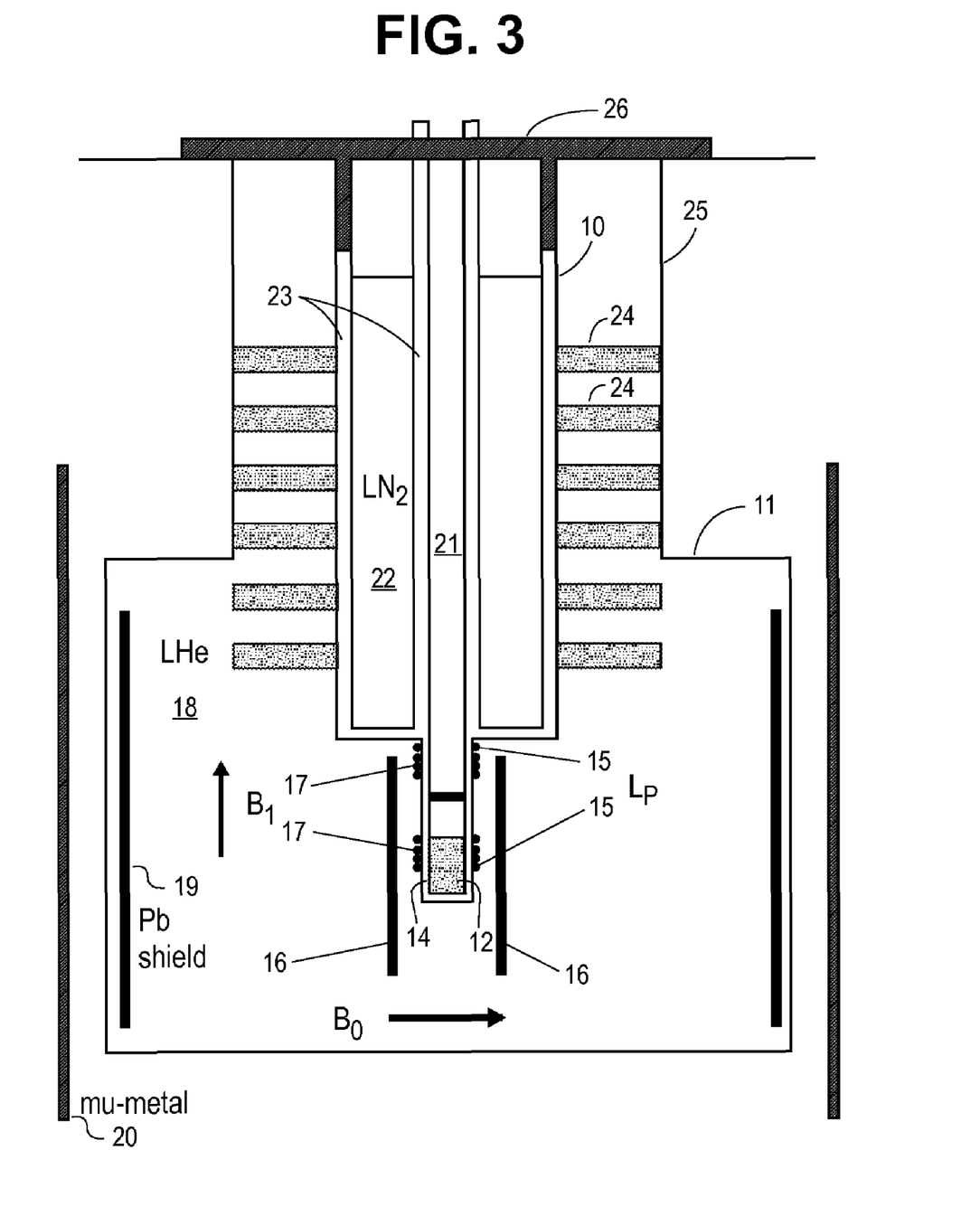
FIG. 3 shows a cryogenic insert for SQUID-detected NMR spectroscopy of liquids.

FIG. 3 shows a cryogenic insert 10 in a LHe filled Dewar 11 for SQUID-detected NMR spectroscopy of liquids. A cell 12 containing the liquid sample was lowered into the tail section 14 of the insert and was maintained at room temperature by a resistive heater. The pickup coil 15 of the SQUID gradiometer, with inductance $L_p$, was wound around the tail section of the insert. Coils 16, 17 to produce the static magnetic field $B_0$ ($B_p$) and excitation pulses $B_1$ ($B_m$) were also located in the helium bath 18. The Dewar 11 was lined with a superconducting Pb shield 19 and the Dewar was surrounded by a single-layer mu-metal shield 20 to attenuate the Earth's magnetic field and external magnetic disturbances.

In an illustrative embodiment, the inner compartment 21 of the insert, into which the sample was lowered, was 22 mm in diameter. This compartment was surrounded by a liquid nitrogen ($LN_2$) jacket 22 with o.d. 100 mm to reduce the heat load of the insert on the LHe bath. At the 100-mm long insert tail section 14, however, the inner compartment extended directly into the LHe bath. A single continuous vacuum jacket 23 isolated the inner compartment of the insert from the $LN_2$ jacket (and from the LHe bath in the tail region), and isolated the $LN_2$ jacket from the LHe bath; the walls of the vacuum space were silvered, with a slit running the length of the insert. The separation between the sample space and the LHe bath was 5 mm. The insert 10 was surrounded by a number of styrofoam radiation baffles 24 which were covered with aluminum foil; these extended laterally from the body of the insert to the neck 25 of the LHe Dewar, and served to reduce the heat load on the bath due to gaseous convection and direct radiation from the top of the Dewar. To minimize the heat load due to thermal conduction of the Pyrex outer walls of the insert, the boiloff from the LHe bath was extracted from the brass top plate 26 of the insert, so that the insert was cooled by the evaporating helium gas. When the tail of the insert was not heated, the system consumed roughly 5 L of LHe per day.

2) SQUID Gradiometer and Readout

A dc SQUID was fabricated using an all-liftoff Nb—AlOx—Nb process. The SQUID parameters were: $2I_c \sim 5$ µA, $R_n/2 \sim 10$ Ω, and $L_s \sim 350$ pH. The peak-to-peak modulation of the SQUID was roughly 40 µV when the SQUID was operated in a well-shielded environment. An 11-turn Nb input coil was integrated onto the SQUID washer.

An illustrative SQUID pickup circuit was configured as a first-order axial gradiometer with pickup loop diameter 38 mm and a baseline of roughly 80 mm, and was wound from 3 mil Nb wire on a fiberglass form that fit around the tail of the cryogenic insert. For NMR measurements at low frequency, an untuned, or superconducting, input circuit was required. Superconducting contacts were made from the Nb wire pickup coil to the on-chip integrated Nb input coil.

Figure 4:
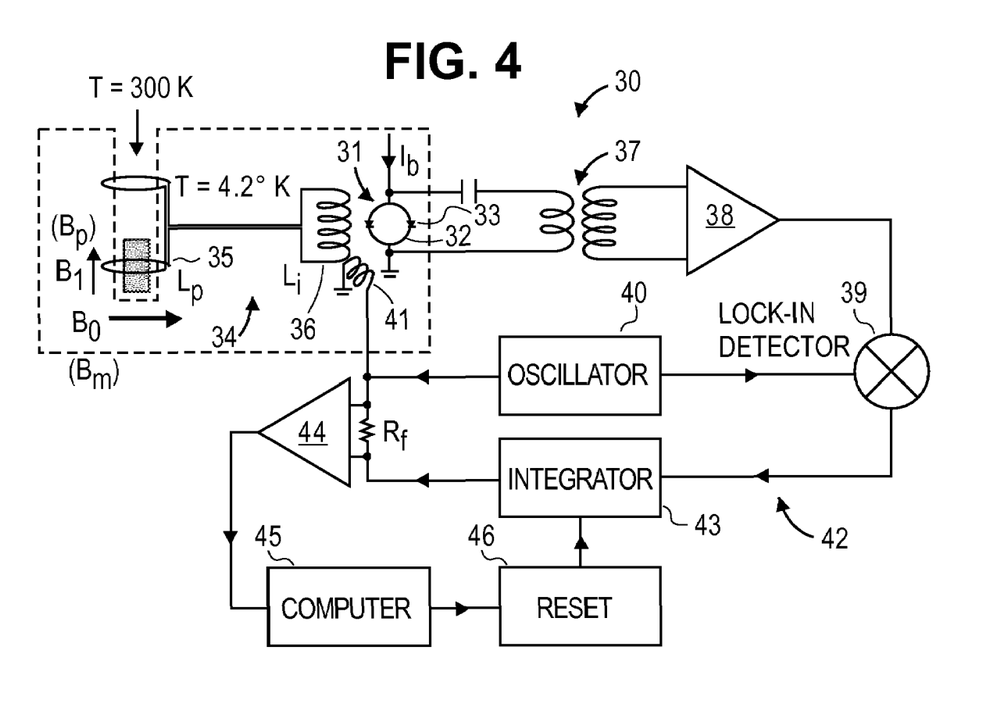
FIG. 4 is a block diagram of the low-$T_c$ SQUID spectrometer apparatus.

A block diagram of the low-$T_c$ SQUID spectrometer apparatus 30 is shown in FIG. 4. The dc SQUID 31 consists of a superconducting loop 32 interrupted by two Josephson junctions 33. When biased with a current $I_b$ slightly above the critical current of the junctions, the SQUID acts as a flux-to-voltage transducer. To enhance its sensitivity to magnetic fields, the SQUID is often operated with a superconducting flux transformer 34 consisting of a pickup coil 35 tightly coupled to the sample and an input coil 36 tightly coupled to the SQUID loop 32. The flux transformer 34 operates on the principle of flux conservation in a superconducting loop, which involves no frequency dependence. Thus, the SQUID magnetometer can detect broadband at arbitrarily low frequencies with no loss in sensitivity.

The input coil 36 (with inductance $L_i$) of the transformer 34 was integrated onto the SQUID chip; the niobium wire pickup coil 35 (with inductance $L_p$) was wound in a gradiometric fashion around the tail section of a cryogenic insert. A single-layer solenoid 17 (FIG. 3) of copper wire wound on the sample cell produced the polarizing field ($B_1$ or $B_p$). A set of coils 16 (FIG. 3) located in the helium bath provided the measurement field ($B_0$ or $B_m$). The SQUID was operated in a flux-locked loop with modulation at 2 MHz, and the signal from the SQUID was amplified, integrated, and fed back to the SQUID as a magnetic flux. The voltage across the feedback resistor $R_f$ was thus proportional to the applied flux. In this way, the SQUID acted as a null detector of magnetic flux.

SQUID operating circuitry is known in the art. In the illustrative circuit of FIG. 4, the output of SQUID 31 is coupled through transformer 37 to amplifier 38 whose output is connected through feedback circuitry 42 to feedback coil 41. Circuitry 42 includes a lock-in detector 39 which receives inputs from amplifier 38 and oscillator 40. The output of detector 39 is integrated by integrator 43. The outputs of integrator 43 and oscillator 40 are input into the two inputs of amplifier 44 which also has resistor $R_f$ connected across the two inputs. $R_f$ is also connected to feedback coil 41. The output of amplifier 44 is input to computer 45 which controls reset circuit 46 which resets integrator 43.

The small-signal bandwidth of the 2 MHz flux-locked loop was around 700 kHz, and the slew rate greater than $10^6$ $\Phi_0/s$. During spin manipulations, the feedback loop was disabled by shorting out the capacitor across the integrator. The signal from the flux-locked loop passed through a sample-and-hold stage (to remove the arbitrary dc level at the loop output) and a set of analog filters before digitization. Signal averaging was performed in software.

3) Static Field and Excitation Coils

For NMR experiments involving resonant spin manipulation, the static Zeeman field was provided by a pair of coils located in the LHe bath and oriented orthogonally to the detection direction. These coils each consisted of 67 turns of Cu-clad NbTi wire wound on a 90 mm diameter frame; the separation of the coils was 55 mm. These coils provided roughly 1.2 mT per applied Ampere of current. Resonant pulses were provided by a pair of coils oriented along the detection direction and placed symmetrically with respect to the gradiometric pickup loops of the detector, in order to minimize the response of the SQUID to the excitation. Each coil consisted of 25 turns of insulated Nb wire wound on the 38-mm diameter frame on which the pickup coil was mounted. The excitation coils produced a field of roughly 830 µT per applied Ampere.

For NMR experiments involving non-resonant spin manipulation, the 67-turn coils located in the helium bath were used to provide a measurement field of the order of a few microtesla. The spins were prepolarized along the detection direction in a field of a few millitesla; the polarizing field was provided by a one- or two-layer solenoid wound directly on the sample cell from Cu wire.

D. Microtesla Field NMR: Experimental

In the experiments, the polarizing field was applied along the detection direction using a one- or two-layer solenoid of copper wire wound directly on the sample cell. Currents of order 1 A were used to generate fields of order 1 mT. The measurement field was supplied by the 67-turn coils located in the LHe bath. The sudden switching of the polarizing coil induced magnetic transients that saturated the detector, giving a deadtime on the order of tens of milliseconds. Spin dephasing during this time resulted in signal loss that could be quite significant at higher measurement fields. A spin echo was used to refocus the sample magnetization. The echo was formed by reversing the direction of the measurement field, and thus the sense of precession of the nuclear spins.

Figure 5:
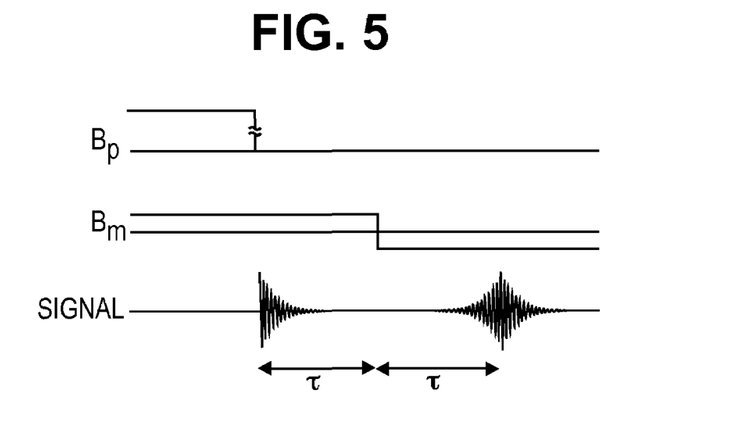
FIG. 5 shows an NMR pulse sequence for the apparatus of FIG. 4.

A pulse sequence for microtesla field NMR is shown in FIG. 5. The polarizing field $B_p$ of order 1 mT is applied for a time that is long compared to the spin-lattice time ($T_1$) of the sample. Following nonadiabatic removal of the polarizing field, the spins precess in the measurement field $B_m$. As the spins precess, they lose phase coherence due to inhomogeneity of the measurement field. At a time $\tau$ following the removal of the polarizing field, the direction of the measurement field is inverted. Neglecting the effects of diffusion and in the absence of any background magnetic fields (fields generated by sources other than the current in the measurement coil), at each location in the sample, the spins see equal and opposite local magnetic fields before and following the inversion of the measurement field. Therefore the phase accumulated by each spin in the interval from $t=0$ to $t=\tau$ is cancelled by the phase accumulated in the interval from $t=\tau$ to $t=2\tau$. At the time $t=2\tau$, phase coherence of the spins is restored, and the echo amplitude is maximum.

The polarizing field $B_p$ is applied along the detection direction, using a solenoid wound directly on the sample cell. The much weaker measurement field $B_m$ is applied in an orthogonal direction. The spins are polarized for a time that is long compared to the spin-lattice relaxation time $T_1$. Precession is initiated by nonadiabatic turnoff of the polarizing field. A spin echo is formed by reversing the direction of the measurement field, and therefore the sense of precession of the nuclear spins.

Figure 6A:
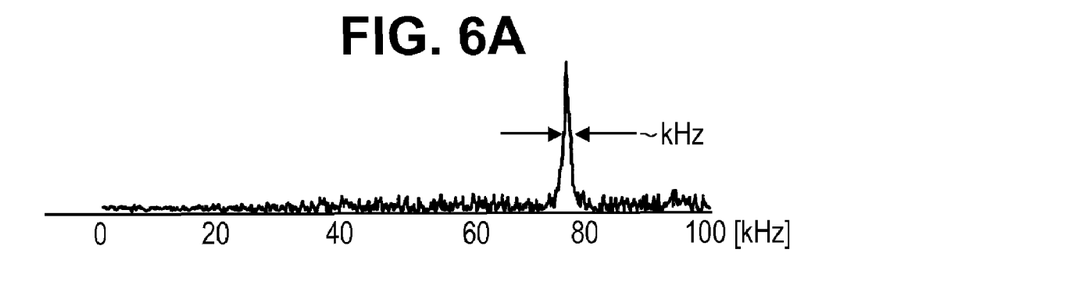
FIGS. 6A, B illustrate SNR enhancement through reduction of the strength of the measurement field.
Figure 6B:
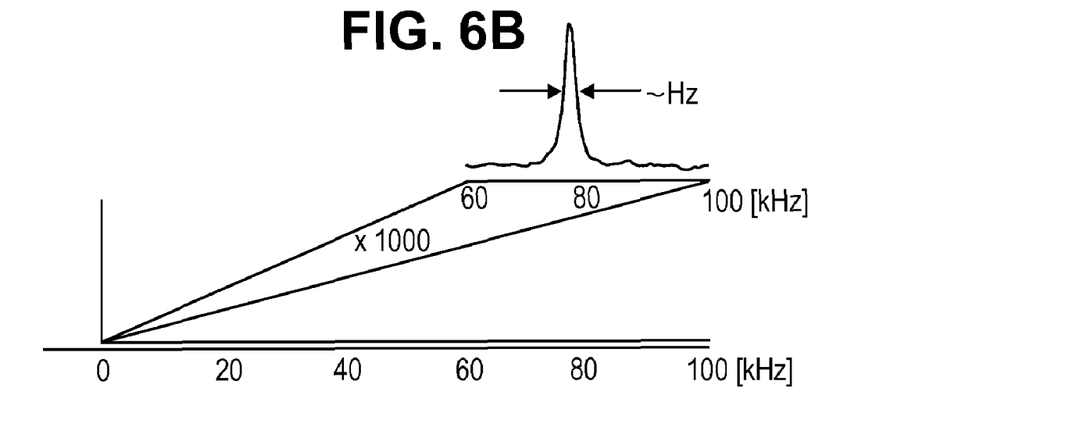

FIGS. 6A, B demonstrate the SNR enhancement achieved by reduction of the measurement field strength. FIG. 6A is an NMR (proton) spectrum of 5 ml of mineral oil acquired in a static magnetic field of 1.8 mT with homogeneity of roughly 10,000 ppm using a conventional Hahn spin echo sequence ($\pi/2$-$\tau$-$\pi$-$\tau$-acq) involving resonant spin manipulation. FIG. 6B shows the NMR signal from the same volume of mineral oil, measured in a field of 1.8 µT using the sequence of FIG. 5. The sample was polarized in a field of around 2 mT; the measurement field was applied with the same magnet used to acquire the spectrum in FIG. 6A. In this case, the proton resonance appears at 77 Hz. The sample magnetizations are the same in these two experiments; moreover, as the detector is untuned, the areas under the NMR lines are also the same. However, when the proton resonance was lowered from 77 kHz to 77 Hz, the NMR linewidth was compressed by a factor of 1000, and the peak height grew by the same factor. Reduction in the measurement field by a factor of 1000 therefore yielded an SNR enhancement of roughly 1000—note that FIG. 6A represents the average of 10,000 transients, while FIG. 6B was obtained from the average of 100 transients. In measurement fields of the order of 1 µT, SNR was a few tens without signal averaging from samples with a volume of a few milliliters and a polarization of order $10^{-8}$.

While there is no advantage in either resolution or SNR to be gained in reducing the measurement field past the point where the contribution of field inhomogeneity to the NMR linewidth becomes comparable to the natural linewidth, proton NMR signals were measured at frequencies as low as 24 Hz.

E. Multinuclear Studies

Figure 7:
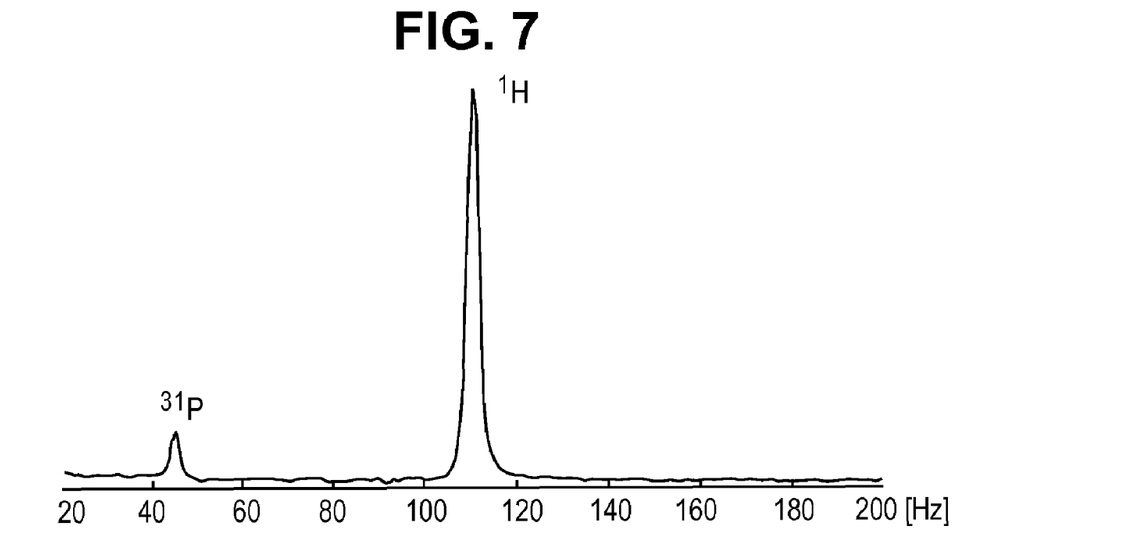
FIG. 7 is the NMR spectrum of 5 ml of 85% phosphoric acid ($H_3PO_4$) measured in a field of 2.6 µT.

When the SQUID magnetometer is operated with an untuned input circuit, it detects broadband. Moreover, as the pulse sequence of FIG. 5 involves switched static fields rather than resonant spin manipulation, excitation occurs over a broad band. The technique is therefore ideally suited to studies of systems containing nuclei with different magnetogyric ratios, resonating at different frequencies. FIG. 7 shows simultaneous SQUID detection of $^1$H and $^{31}$P resonances in a field of 2.6 µT.

FIG. 7 is an NMR spectrum of 5 ml of 85% phosphoric acid ($H_3PO_4$) measured in a field of 2.6 µT. The spectrum is the average of 1000 transients. The magnetogyric ratios of the spin-1/2 nuclei $^1$H and $^{31}$P differ by a factor of 2.5. The proton resonance appears at 110 Hz; the $^{31}$P resonance is clearly resolved at 44 Hz. The relative intensity of the two lines is determined by the different spin densities of the two nuclear species, as well as by the difference in thermal magnetizations brought about as a result of the difference in magnetogyric ratios.

F. Scalar Couplings

While all chemical shift information is lost in low magnetic field, scalar (or "J") couplings, which are field independent, are preserved. These scalar couplings act as signatures of specific covalent bonds. The enhanced resolution achieved by moving the resonance to low field makes it possible to accurately determine scalar coupling strengths, even in inhomogeneous measurement fields.

Figure 8A:
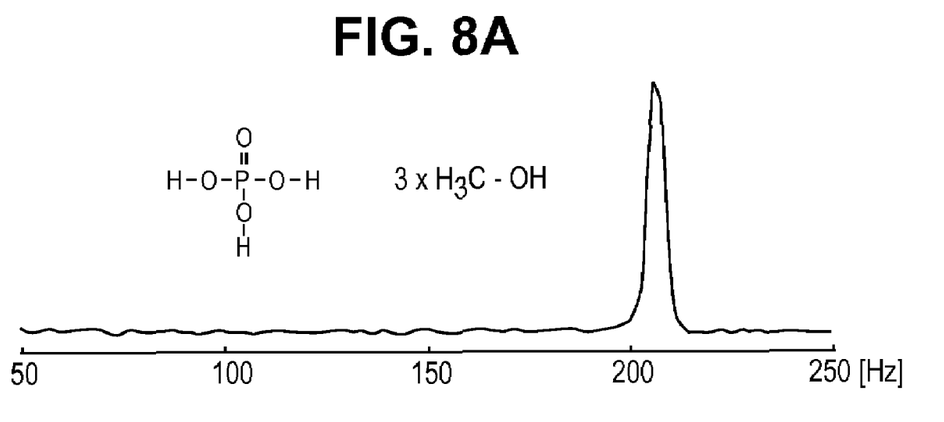
FIGS. 8A, B illustrate the resolution of scalar couplings in microtesla fields.
Figure 8B:
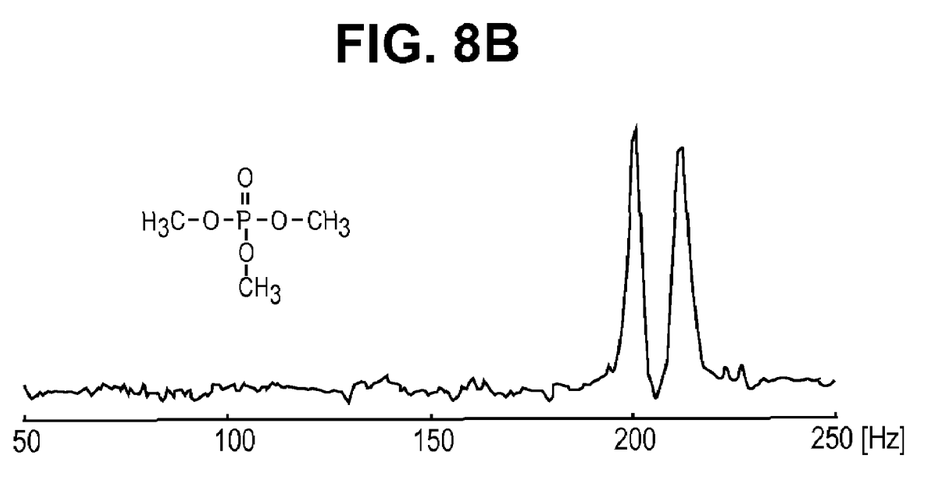

FIG. 8A shows the NMR spectrum obtained from a mixture of methanol and phosphoric acid, measured in a field of 4.8 µT. The proton spectrum consists of a sharp singlet at 205 Hz. However, when the methanol and phosphoric acid are allowed to react to form the ester trimethyl phosphate, scalar coupling to the $^{31}$P nucleus causes the proton resonance to split into a doublet, with a coupling strength $J_3[P,H]=10.4\pm0.6$ Hz which is characteristic of this particular next-next-nearest neighbor interaction (FIG. 8B). The proton doublet is easily resolved in a field of 4.8 µT, despite a relative field homogeneity of roughly 10,000 ppm over the sample volume.

FIG. 8A is an NMR spectrum of 5 ml of 3 parts methanol, 1 part phosphoric acid (85% in water) measured in a field of 4.8 µT. The spectrum is the average of 100 transients. Rapid spin exchange with the protons in water obscures the proton-phosphorous scalar coupling in phosphoric acid, and the proton spectrum consists of a sharp singlet. FIG. 8B is an NMR spectrum of 3 ml of neat trimethyl phosphate (Sigma-Aldrich) measured in a field of 4.8 µT. The spectrum is the average of 100 transients. Electron-mediated scalar coupling of the nine equivalent protons to the $^{31}$P nucleus splits the proton resonance into a doublet, with a splitting that is determined by the coupling strength J. For this particular coupling via three covalent bonds, $J_3[P,H]=10.4\pm0.6$ Hz. Scalar coupling to the nine equivalent protons splits the $^{31}$P resonance into ten lines; these are below the noise level.

Because electron-mediated scalar couplings between nuclear spins act as signatures of specific covalent bonds, these techniques could form the basis of a simple low-field NMR "bond detector", insensitive to chemical shifts, but yielding accurate information about scalar couplings. Such a detector could be applied to the study of analytes, chemical reactions, and molecular conformations. For example, the dispersion of J-values for sp$^3$ $^1$H—$^{13}$C bonds is approximately 10 times greater than the NMR linewidths achieved in our experiments. If the values of J-couplings are known, then pure J-spectra could allow one to assign a number of molecular groups. Considering the highly developed techniques for isotopic labeling in biomolecular NMR, the use of such a method for following a "spy nucleus" through bond formation is an appealing possibility. An illustrative proton spectrum was obtained from 5 ml of carbonyl labeled glycine in $D_2O$ in a field of 3.7 µT. The resonance of the two equivalent α-protons is split into a doublet due to scalar coupling to the $^{13}$C nucleus. The coupling strength was determined from the lineshape of the doublet to be $J_2[C,H]=5\pm1$ Hz.

G. Experimental Apparatus for MRI: Magnetic Field and Gradient Coils

To perform MRI experiments in extremely low magnetic field, a convenient starting point was a zero magnetic field region. A set of three orthogonal cancellation coils 51 (FIG. 9) were used to zero out the field of the Earth over the measurement region. These coils were wound around the perimeters of the six faces of a cube 50 that measured roughly 2 m on a side. Braces integrated into the cube structure supported a coil assembly 52 which consisted of: (1) a Helmholtz pair 53, used to produce a measurement field in the range of µT to tens of µT; (2) a Maxwell pair 54, used to generate the diagonal component $G_z \equiv dB_z/dz$ of the magnetic field gradient tensor; and two sets of saddle coils 55, 56 wound in the Golay geometry, used to generate the off-diagonal components $G_x \equiv dB_z/dx$ and $G_y \equiv dB_z/dy$ of the gradient tensor. In addition, the braces supported the fiberglass LHe Dewar which housed the SQUID sensors. All support structures and coil forms were made from wood, which in many ways was an ideal material since wood is non-magnetic and non-conducting. The dimensions of the system were selected considering the eventual imaging of human subjects: an average-sized adult can fit (not too uncomfortably) into the measurement region at the center of the cube.

Figure 9:
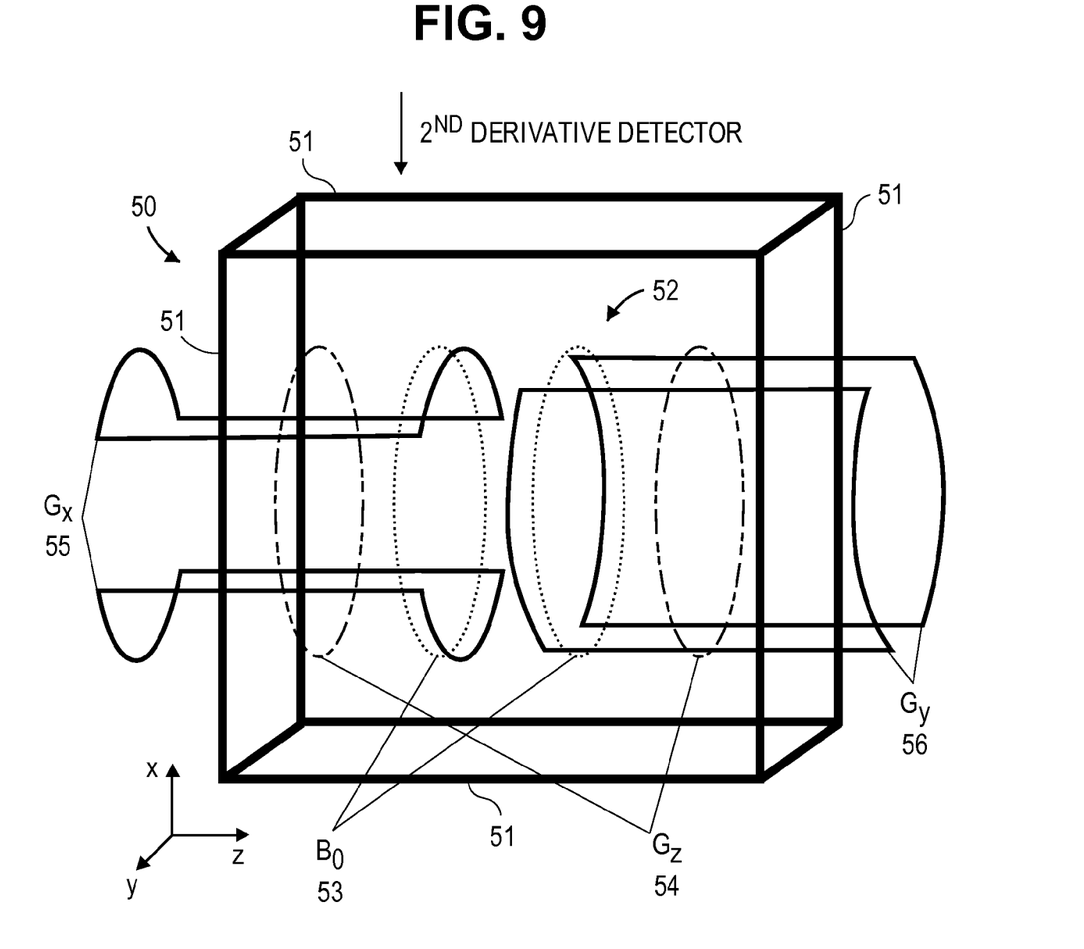
FIG. 9 shows the magnetic field and magnetic field gradient coils for SQUID-detected MRI.

A schematic of the coil system 52 is shown in FIG. 9. Following the convention in the magnetic resonance community, the z axis lies along the measurement field direction; the x axis is chosen to coincide with the vertical direction (the detection direction).

FIG. 9 shows the magnetic field and magnetic field gradient coils for SQUID-detected MRI. Six 100-turn coils 51 wound on each face of a cube, 2 m on a side, were used to cancel the magnetic field of the Earth. The measurement field $B_0$ was produced by a Helmholtz pair 53 arranged in the center of the cube. The diagonal component $G_z$ of the first-order magnetic field gradient tensor was produced by a Maxwell pair 54; the off-diagonal gradients $G_x$ and $G_y$ were produced by saddle coils 55, 56 wound in the Golay geometry (for each set of Golay coils, only two of the four saddle coils are shown). The detector was a second-order axial SQUID gradiometer oriented in the vertical (x) direction, and which was housed in a LHe Dewar suspended in the center of the cube.

1. Cancellation Coils

Each of the six cancellation coils consisted of 100 turns of 18 gauge copper wire wound in a groove cut along the outer edge of a wooden frame which made up one of the six faces of the cube. The coils on opposite faces of the cube were wired in series. Each pair had a resistance of roughly 30 Ω, and generated a magnetic field change of around 50 µT per applied Ampere, so that only fractions of Amperes and modest voltages were required to cancel the three components of Earth's field. Heating in the cancellation coils was negligible. (For the record, a total of about 2.7 miles of 18 gauge Cu wire—approximately 60 lbs—went into the cancellation coils).

2. Measurement Field and Gradient Coils

The measurement field was produced by a Helmholtz pair with radius 0.6 m arranged in the center of the cube. Each coil consisted of 20 turns of 18 gauge copper wire. The diagonal component $G_z$ of the gradient tensor was generated by a Maxwell pair with radius 0.6 m mounted outside the measurement field coils. Each coil consisted of 20 turns of 18 gauge wire. The off-diagonal gradients $G_x$ and $G_y$ were generated by saddle coils wound in the Golay geometry from 20 turns of 22 gauge wire; the radius of curvature of the Golay coils was 0.6 m. These coils were wound in grooves cut along the outer edges of circular pieces of plywood. Per Ampere of applied current, these coils generated: 1) $B_0=30$ μT; 2) $G_z=50$ μT/m; and 3) $G_x=G_y=50$ μT/m.

3. Polarizing Coil

In order to enhance the sample magnetization, the spins were prepolarized in a magnetic field of the order of tens of millitesla. Precession was induced either by non-adiabatic turnoff of the polarizing field (in which case the spins were polarized in a direction orthogonal to the measurement field), or by adiabatic turnoff of the polarizing field followed by resonant excitation in the much lower measurement field (in which case the spins were typically polarized along the measurement field direction). In the first instance, the polarizing field had to be switched in a time which was short compared to the Larmor period in the measurement field; in the second instance, the switching requirements were less strict: turnoff of the polarizing field needed to occur simply in a time which was short compared to the spin-lattice relaxation time $T_1$. In either case, the requirement of rapid field switching, coupled with practical limits to the level of Joule heating which could be tolerated in the magnet wire, governed the design of the polarizing coil.

For rapid switching it is advantageous to use relatively heavy gauge wire and a relatively small number of turns. The polarizing magnet consisted of two poles wound from 18 gauge copper wire on fiberglass frames. On each pole, the magnet windings filled a 17 mm wide channel, with a 15 mm radius for the inner windings and a 70 mm radius for the outer windings. The separation of the two magnet poles was roughly 100 mm. A total of 510 turns was used for each magnet pole. The field at the center of the coils was approximately 4 mT per applied Ampere; the total resistance of the magnet pair was approximately 6 Ω, while the inductance was roughly 100 mH. The heavy formvar insulation of the magnet wire seemed to tolerate Joule heating at a level of 100 W per magnet pole. To achieve higher polarizing fields, however, it would be necessary to water cool the magnet. While the homogeneity of the polarizing field was quite poor, this of course had no effect on NMR linewidth or SNR.

The condition for nonadiabatic turnoff of the polarizing field can be written as follows:

$$\frac{dB}{dt} \gg B\omega = \gamma B^2,$$

where B is the instantaneous strength of the magnetic field. For measurement fields in the microtesla range, it is easy to meet the nonadiabatic switching condition, as the term on the right hand side becomes extremely small as the strength of the measurement field is reduced. Indeed, in our experiments, it was sufficient to drive the polarizing coil with a shaped voltage pulse from a Techron 7700 amplifier. At the turnoff of the pulse, the coil would discharge with an L/R time governed by the self-inductance of the coil (again, around 100 mH) and the output impedance of the amplifier (a few tens of ohms). Driving the polarizing coil in this "controlled voltage" mode had the advantage that, following the turnoff of the polarizing field, a mechanical relay in series with the polarizing coil could be opened to decouple the SQUID gradiometer from noise generated by the Techron amplifier, as well as from the thermal noise of the polarizing coil itself. With this simple switching scheme, the nonadiabatic criterion was satisfied for proton Larmor frequencies extending to around 2 kHz. As the strength of the measurement field was increased beyond this value, some loss in signal occurred, due presumably to adiabatic reorientation of the sample magnetization during turnoff of the polarizing field. At higher measurement frequencies, a scheme involving adiabatic removal of the polarizing field and resonant spin excitation was used.

4. Spin Echo Coil

Resonant spin echo pulses were produced with a pair of coils oriented along the y direction. The coils each consisted of 10 turns of copper wire, wound on circular fiberglass forms with radius 60 mm which were mounted rigidly to the polarizing coil forms. In the case of the NMR and MRI experiments performed in this system, resonant echoes were preferable to echoes formed by inverting the direction of the measurement field, as the latter type of echo does not refocus dephasing from external magnetic field gradients (either the gradients $G_x$, $G_y$, $G_z$ which were used for the encoding, or spurious gradients due to nearby magnetic objects). For Larmor frequencies of the order of 1 kHz, a typical π pulse consisted of two or three cycles, and required currents of order 10 mA.

H. Experimental Apparatus for MRI: SQUID Sensors

The SQUID system which was housed in the LHe Dewar in the center of the cube consisted of four channels: a single large-area sensing channel and three orthogonal magnetometer references. The pickup coil of the sensor was configured as a second-order axial gradiometer oriented along the x axis (vertical direction); the gradiometer was therefore sensitive to the component $d^2B_x/dx^2$ of the second-order magnetic field gradient tensor. The pickup loops of the gradiometer were wound from 3 mil Nb wire in grooves which were carefully machined in a cylindrical G10 fiberglass form. The radius of each pickup loop was roughly 15 mm, and the gradiometer baseline was 50+50 mm. The form on which the pickup loop was wound fit snugly into the tail section of the fiberglass LHe Dewar. The distance from the sensing loop of the gradiometer to the sample, which was positioned directly under the tail of the LHe Dewar, was roughly 10 mm. The sensing SQUID was housed in a superconducting box machined from a solid block of Pb and located in the LHe Dewar at a distance of approximately 300 mm from the sensing coil of the gradiometer. Superconducting contact from the Nb wire pickup coil to the 11-turn Nb input coil integrated on the SQUID chip was achieved using the solder blob technique. The sensing SQUID was operated in a flux-locked loop with modulation at 2 MHz.

The NMR detector was a second-order axial gradiometer with an overall baseline of 100 mm. The probe also incorporated a three-axis reference magnetometer; the reference SQUIDs were mounted on orthogonal faces of a G10 fiberglass cube which was positioned inside the cylindrical form on which the pickup coil of the gradiometer was wound.

The inductance of the sensing SQUID was roughly 350 pH. This yields for the 11-turn input coil a self inductance $L_i$=40 nH and a mutual inductance to the SQUID of M=3.9 nH. For a 1+2+1 turn second-order gradiometer with pickup loop radius r=15 mm, $L_p$=700 nH. The above parameters yield a gradiometer sensing area $A_{sense}$ of approximately 3.7 mm². Note that the sensing area of the gradiometer could be improved substantially by proper matching of $L_i$ and $L_p$. In particular, by increasing the number of turns in the input coil to around 45, so that $L_i$~700 nH, the sensing area of the gradiometer could be increased to roughly 8 mm². However, even for a reduced sensing area of 3.7 mm², system noise was dominated by external sources of thermal noise and interference, not by the intrinsic noise of the detector. In this case, inductance mismatch does not degrade SNR, as signal and noise are attenuated equally.

To measure the balance of the gradiometer with respect to uniform fields in the three orthogonal directions, known, highly uniform fields were applied to the sensor using the cancellation coils wound on the faces of the cube, while monitoring the flux that was coupled to the sensing SQUID. The typical gradiometer balance was one part in a few hundred for both in-plane and out-of-plane fields. To achieve this level of balance, however, parasitic inductance associated with the Nb wire leads which ran between the gradiometer loops, and which were not twisted together, was minimized.

Finally, the probe incorporated a three axis SQUID magnetometer consisting of three Nb—AlOx—Nb SQUIDs mounted on three orthogonal faces of a G10 fiberglass cube. This reference cube was mounted inside the fiberglass form on which the gradiometric pickup coil of the sensing SQUID was wound. Each of the reference SQUIDs had an effective area of roughly 0.03 mm², and was operated in a flux-locked loop with modulation at 100 kHz. Analog subtraction of the reference signals from the gradiometer signal was used to improve the balance of the gradiometer, in an attempt to further reduce the contribution of distant noise sources to the system noise.

I. Choice of Measurement Field

In all of the NMR and MRI experiments performed in this system, the sample magnetization was enhanced by prepolarization in a field of the order of tens of millitesla. In the case of fixed sample magnetization and detection with an untuned SQUID magnetometer or gradiometer, the integrated intensity of the NMR signal is independent of the strength of the measurement field. This allowed considerable freedom in the choice of measurement field strength for the experiments. The choice of measurement field was dictated by the following considerations: 1) inhomogeneous broadening due to spurious gradients generated by measurement field coil; 2) level of environmental interference and noise over the signal band; and 3) the strength of fields generated by gradient coils, relative to the measurement field strength (possible image distortion due to concomitant gradients).

J. NMR Experiments

The procedure for performing NMR experiments in the cube was as follows. First, appropriate currents were passed through the cancellation coils to zero out the static magnetic field of the Earth over the measurement region. For this purpose, a three-axis fluxgate magnetometer placed directly under the tail of the cryostat was used to monitor the field in the measurement region. The desired measurement field, of the order of microtesla or tens of microtesla, was then applied with the 1.2 m diameter Helmholtz pair. After allowing some time for the measurement field to stabilize, the sample was placed under the tail of the cryostat and tuned the SQUID gradiometer.

As mentioned above, two different polarization and excitation schemes were employed in the experiments: at lower measurement fields (corresponding to Larmor frequencies below about 2 kHz), spin precession was initiated by nonadiabatic turnoff of the polarizing field; at higher measurement fields, the polarizing field was reduced to zero adiabatically, and a resonant π/2 pulse was used to induce precession. In both cases, a spin echo, which was formed with a resonant π pulse, was typically detected.

Figure 10A:
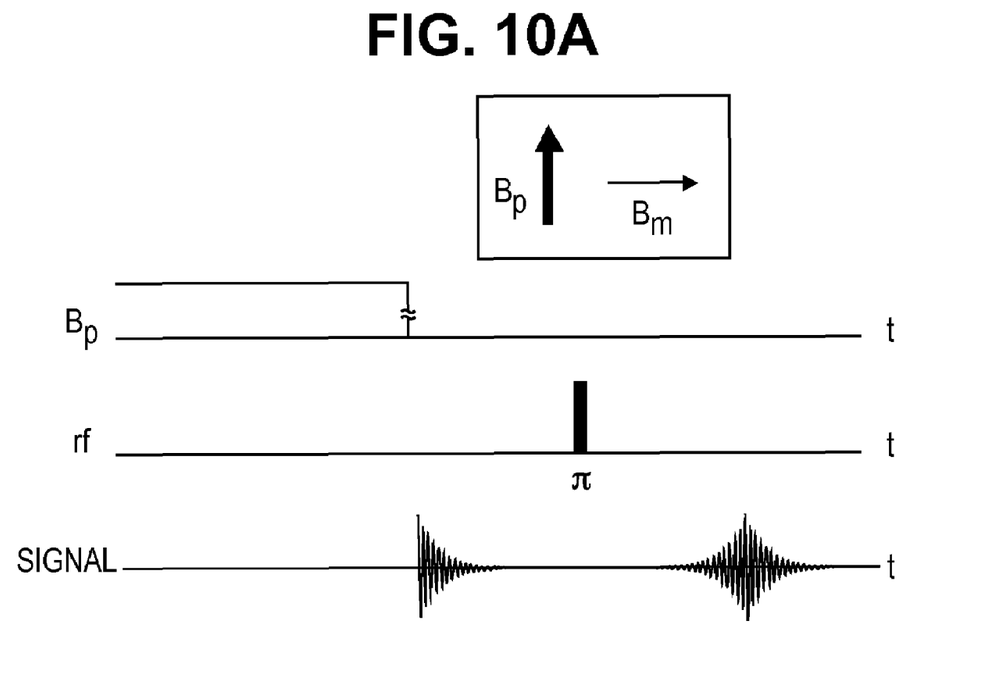
FIGS. 10A, B are pulse sequences used for SQUID-detected MRI.
Figure 10B:
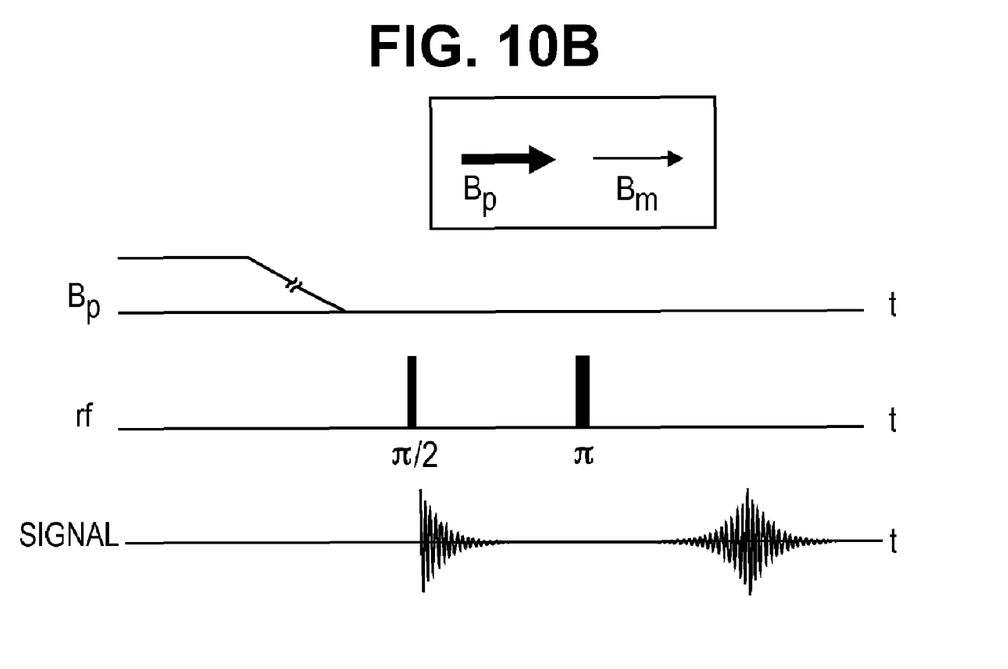

FIGS. 10A, B show pulse sequences used for SQUID-detected MRI. In the sequence of FIG. 10A, precession is induced by the nonadiabatic turnoff of the polarizing field $B_p$ (of the order of tens of millitesla), which is oriented in a direction orthogonal to the measurement field $B_m$. The measurement field is static; a spin echo is formed with a resonant π pulse. In the sequence of FIG. 10B, the strength of the polarizing field $B_p$ is reduced adiabatically to zero, and precession is induced with a resonant π/2 pulse. In this case, the polarizing field is applied along the measurement field direction, to avoid signal loss due to imperfect fulfillment of the adiabatic switching criterion. In both cases, turnoff of the polarizing field is accomplished in a time of order 10 ms; adiabaticity or nonadibaticity of the turnoff is determined by the Larmor period of the nuclear spins in the measurement field. The nonadiabatic turnoff was used for measurement fields below about 50 µT; at higher measurement field strengths, the switching of the polarizing field was adiabatic, and only the adiabatic sequence was used.

In the experiments, polarizing field strengths were of the order of a few tens of millitesla, and the polarizing field was applied for a time which was long compared to the spin-lattice relaxation time $T_1$ of the sample (polarizing intervals of 2–3s were used for water, and of around 100 ms for mineral oil). Following turnoff of the polarizing field and application of the echo pulse, mechanical relays in series with the polarizing and echo coils were opened. This was done to isolate the SQUID gradiometer from the noise of the amplifiers used to drive the polarizing and echo coils, as well as to prevent the flow of Nyquist noise currents in these coils. The flux-locked loop was enabled shortly after transmission of the echo pulse. The output of the flux-locked loop was passed through sample-and-hold and filtering stages and then digitized; signal averaging was performed in software.

When the external gradients were properly compensated, NMR linewidths of order 1 Hz were obtained from a test sample of water. With a polarizing field of roughly 40 mT, an SNR ratio of 50 was obtained in a single shot from a sample of around 20 ml of water.

K. MRI Experiments

For imaging experiments, projection reconstruction was chosen over Fourier reconstruction due to the limited hardware requirements as well as the ease with which this encoding scheme is adapted to SQUID detection. MRIs were acquired from tap water or mineral oil phantoms. The phantoms were chosen to have translational symmetry in one direction, which was arranged to coincide with the axis of the second-order gradiometer (the x axis). The lateral (y-z) dimensions of the phantom were chosen to roughly match the dimensions of the sensing loop of the gradiometer (30 mm diameter). The gradient component $G_x$ was nulled out using the appropriate set of Golay coils; applied gradients $G_y$ and $G_z$ were used to encode in the y-z plane. No attempt was made to perform slice selection, although of course the sensitivity of the SQUID gradiometer fell off rapidly as a function of the separation of the source from the sensing loop. Therefore the MRIs obtained were two-dimensional cross sectional images of the phantoms.

The first experiments were carried out with tap water phantoms. In this case, the long $T_2$ (of the order of seconds) made it possible to achieve very narrow lines of 1–2 Hz in low field, and therefore to take full advantage of signal bandwidth narrowing in order to enhance SNR and resolution. However, the long $T_1$ necessitated polarization times of the order of seconds. Due to the long polarizing interval, overall image acquisition times were rather long, of the order of a few hours.

Subsequent imaging experiments were performed with mineral oil, which in any case is a better match to human tissue in terms of its NMR relaxation properties. Here $T_2$ is shorter, and (lifetime limited) proton linewidths of around 5 Hz were achieved. The broader NMR lines required encoding over a broader band in the MRI experiments. On the other hand, the shorter $T_1$ of mineral oil enabled a significant decrease in the polarizing interval, to around 100 ms, resulting in a substantial reduction in image acquisition times.

Preliminary experiments such as this demonstrated the soundness of the concept of microtesla field MRI. However, the acquisition times could be substantially reduced by reduction of the system noise.

Further experiments have been done with a low-noise G10 fiberglass cryostat that can accommodate a gradiometer with pickup coil diameter up to 160 mm. A second-order gradiometer was constructed with an overall baseline of 150 mm, and pickup loop diameter 65 mm. The 1+2+1 turn pickup coil has an inductance of roughly 1.7 µH, yielding a gradiometer sensing area $A_{sense}$=7.6 mm². In addition, in order to eliminate the contribution to the system noise from distant sources of noise and interference, an eddy current shield surrounds the SQUID MRI system. The shield consists of a single layer of ⅛" (roughly 3 mm) 5052 Al plate ($\rho$=4.8 µΩ cm); its dimensions are 8'×8'×12'. At a frequency of around 5 kHz, the shield is roughly two skin depths thick, corresponding to an attenuation of interfering fields in the relevant frequency range by an order of magnitude. Inside this eddy current shield and with the new, large-area gradiometer, the thermal noise from the CTF Dewar was around 2.5 fT/Hz$^{1/2}$ at a frequency of 5 kHz; at the moment, the system noise is dominated entirely by thermal noise from the Dewar. The current noise level of 2.5 fT/Hz$^{1/2}$ is roughly a factor of 6 lower than the noise level achieved in the prior measurements, corresponding to a potential reduction in MRI acquisition time by a factor of 36.

The larger pickup coil of the new gradiometer will allow acquisition of MRIs from larger samples, and some in vivo imaging experiments. However, the larger area of the sensing loop entails a significant loss of sensitivity to dipole sources (and in MRI, one is concerned with dipole sources). The signal flux coupled to a pickup loop of radius r from a dipole goes as $r^{-1}$ (this is seen easily if the problem is viewed in terms of mutual inductances). On the other hand, in the case of a system whose noise is dominated by the magnetic field environment, the noise flux coupled to the pickup loop will go as $r^2$. Therefore, in more than doubling the diameter of the gradiometer sensing loop, the sensitivity to magnetic dipoles decreased by more than a factor of $2^3$=8, roughly canceling the advantage gained in reducing the magnetic field noise of the system. Due to these considerations, it will ultimately be desirable to replace the single large-area sensor with an array of smaller sensors, designed for maximum sensitivity to localized sources. This is in fact the current trend in high-field clinical MRI, where system noise is dominated by inductively coupled losses from the human body.

L. CONCLUSION

Thus the invention provides method and apparatus for obtaining nuclear magnetic resonance (NMR) spectra of liquids in fields of a few microtesla using prepolarization in fields of a few millitesla and detection with a dc superconducting quantum interference device (SQUID). Because the sensitivity of the SQUID is frequency independent, both signal-to-noise ratio and spectral resolution are enhanced by detecting the NMR signal in extremely low magnetic fields, where the NMR lines become very narrow even for grossly inhomogeneous measurement fields.

The technique of bandwidth-narrowing through measurement in microtesla fields can also be applied to magnetic resonance imaging (MRI). In MRI, the ultimate spatial resolution is determined by the width of the NMR line in the absence of applied magnetic field gradients. For MRI performed in low field with linewidths approaching the lifetime limit, relatively high spatial resolution is achievable with modest magnetic field gradients. As a result the NMR signal is dispersed over only a narrow band, resulting in a high S/N ratio, and thus a short acquisition time. Furthermore, distortions due to spurious gradients generated as a result of spatial variations in magnetic susceptibility can be minimized in low field.

The invention thus leads to low-cost, portable MRI scanners as well as open MRI systems, which would have significant advantages.

The low-field MRI techniques of the invention could readily be adapted for use with existing commercial SQUID systems designed to measure weak magnetic signals generated by electrical currents in the human body. Here, the frequency-independent response of the untuned SQUID magnetometer would be exploited to detect biomagnetic signals at frequencies in the range of Hz to tens of Hz, as well as to perform MRI at proton Larmor frequencies on the order of kHz. It would be particularly useful to develop a SQUID system which could be used for both MRI and magnetoencephalography (MEG). In MEG, an array of low-$T_c$ SQUID sensors (up to 300 channels in state-of-the-art systems) is used to measure weak neuromagnetic signals (of the order of tens of fT) in order to map out electrical activity in the brain; the technique is rapidly becoming more widespread in clinical use, especially for studies of epilepsy and for pre-surgical screening of brain tumors. The ability to perform MRI would greatly increase the utility of the SQUID system, creating a versatile, new tool for studies of the human brain.

Figure 11:
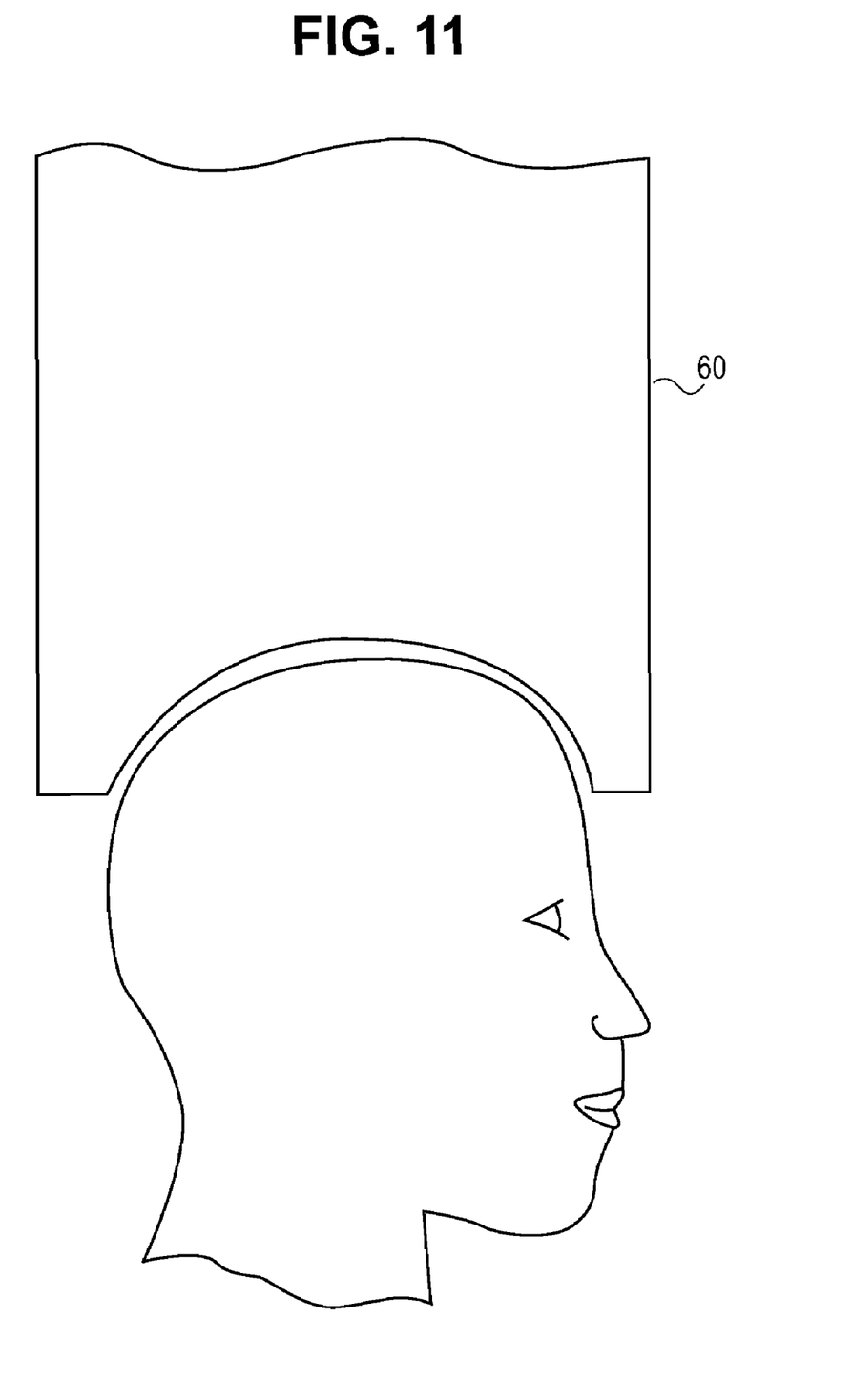
FIG. 11 illustrates a combined MEG and MRI apparatus.

FIG. 11 illustrates a patient under a combined MEG/MRI helmet or apparatus 60.

Changes and modifications in the specifically described embodiments can be carried out without departing from the scope of the invention which is intended to be limited only by the scope of the appended claims.

The invention claimed is:

1. A method for nuclear magnetic resonance (NMR) of a sample in the Earth's magnetic field, comprising:
   canceling the magnetic field of the Earth;
   prepolarizing nuclear spins in the sample in a millitesla magnetic field;

detecting nuclear magnetic resonance (NMR) signals from the sample in a microtesla magnetic field with an untuned low critical temperature ($T_c$) superconducting quantum interference device (SQUID) magnetometer.

2. The method of claim 1 wherein the detecting magnetic field is in the range of about 150 µT to about 1 µT.

3. The method of claim 2 wherein the prepolarizing magnetic field is tens of mT.

4. The method of claim 1 wherein the SQUID is maintained substantially at liquid helium temperature and the sample is at room temperature.

5. The method of claim 1 wherein the prepolarization is performed by resonant spin manipulation and the prepolarization and detection fields are orthogonal.

6. The method of claim 1 wherein the prepolarization is performed by nonresonant spin manipulation and the prepolarization and detection fields are parallel.

7. The method of claim 1 wherein the detection magnetic field is substantially inhomogeneous.

8. The method of claim 1 further comprising operating the SQUID in a flux locked mode.

9. The method of claim 8 wherein the output of the SQUID is amplified, integrated, and then fed back to a flux modulating coil positioned near the input coil of the SQUID.

10. The method of claim 1 further comprising performing magnetic resonance imaging (MRI) of the sample by forming an image from the detected NMR signals.

11. The method of claim 10 further comprising applying encoding magnetic field gradients to the sample.

12. The method of claim 1 further comprising simultaneously detecting multinuclear species.

13. The method of claim 1 further comprising obtaining scalar ("J") coupling information from the NMR signals.

14. Apparatus for nuclear magnetic resonance (NMR) of a sample in the Earth's magnetic field, comprising:

canceling the magnetic field of the Earth;

prepolarization coils for providing a millitesla magnetic field for prepolarizing nuclear spins in the sample;

measurement coils for providing a microtesla magnetic field for detecting nuclear magnetic resonance (NMR) signals from the sample;

an untuned low critical temperature ($T_c$) superconducting quantum interference device (SQUID) magnetometer for detecting nuclear magnetic resonance (NMR) signals from the sample.

15. The apparatus of claim 14 further comprising a flux locked loop connected to the SQUID.

16. The apparatus of claim 14 wherein the detecting magnetic field is in the range of about 150 µT to about 1 µT and the prepolarizing magnetic field is tens of mT.

17. The apparatus of claim 14 further comprising a liquid helium Dewar in which the SQUID is mounted to maintain the SQUID at liquid helium temperature while the sample is at room temperature.

18. The apparatus of claim 14 further comprising means to perform magnetic resonance imaging (MRI) of the sample by forming an image from the detected NMR signals.

19. The apparatus of claim 18 wherein the means to perform MRI include gradient field coils.

20. The apparatus of claim 18 further comprising a SQUID array for performing magnetoencephalography.

* * * * *